(12) United States Patent
Son et al.

(10) Patent No.: US 8,062,766 B2
(45) Date of Patent: Nov. 22, 2011

(54) ELECTROLUMINESCENT POLYMER AND ORGANIC ELECTROLUMINESCENT DEVICE USING THE SAME

(75) Inventors: Jhun-Mo Son, Yongin-si (KR); Yu-Jin Kim, Suwon-si (KR); Sang-Hoon Park, Seongnam-si (KR); Jong-Jin Park, Guri-si (KR); O-Hyun Kwon, Seoul (KR); Young-Mok Son, Hwaseong-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1076 days.

(21) Appl. No.: 11/600,110

(22) Filed: Nov. 16, 2006

(65) Prior Publication Data

US 2007/0173633 A1 Jul. 26, 2007

(30) Foreign Application Priority Data

Jan. 26, 2006 (KR) .................. 10-2006-0008238

(51) Int. Cl.
*C08G 61/12* (2006.01)
*C09K 11/06* (2006.01)
*H01L 51/54* (2006.01)

(52) U.S. Cl. ...................... 428/690; 528/423

(58) Field of Classification Search .......... 428/690, 428/917, 411.1, 336; 313/502–509; 257/40, 257/88, 104, E51; 532/1; 540/1; 528/377, 528/330, 397, 394, 422
See application file for complete search history.

(56) References Cited

U.S. PATENT DOCUMENTS

| 6,169,163 | B1 | 1/2001 | Woo et al. |
| 2004/0072989 | A1* | 4/2004 | Son et al. ............ 528/397 |

FOREIGN PATENT DOCUMENTS

| JP | 62225518 A | * 10/1987 |
| JP | 2003165829 A | * 6/2003 |

OTHER PUBLICATIONS

Stéphan et al., "Blue light electroluminescent devices based on a copolymer derived from fluorene and carbazole", Synthetic Metals 106 (1999) pp. 115-119.

* cited by examiner

*Primary Examiner* — Angela Ortiz
*Assistant Examiner* — J. L. Yang
(74) *Attorney, Agent, or Firm* — Robert E. Bushnell, Esq.

(57) ABSTRACT

Provided are an electroluminescent polymer including repeating units of Formula (1) below and repeating units of Formula (2) below and an organic electroluminescent device including an organic layer having the electroluminescent polymer, wherein the organic electroluminescent device has high luminance, high efficiency, and high color purity:

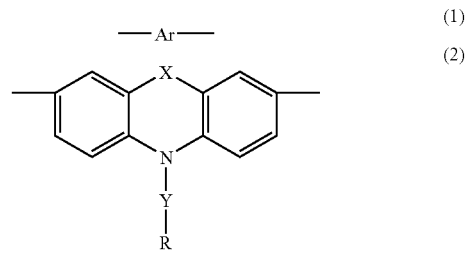

where Ar, X, Y, and R are the same as described in the detailed description of the invention and the claims.

8 Claims, 5 Drawing Sheets

(FORMULA 6)

(FORMULA 4)

(FORMULA 6)

ELECTROLUMINESCENT POLYMER AND ORGANIC ELECTROLUMINESCENT DEVICE USING THE SAME

CROSS-REFERENCE TO RELATED PATENT APPLICATION AND CLAIM OF PRIORITY

This application claims the benefit of Korean Patent Application No. 10-2006-0008238, filed on Jan. 26, 2006, in the Korean Intellectual Property Office, the disclosure of which is incorporated herein in its entirety by reference.

BACKGROUND OF THE INVENTION

1. Field of the Invention

The present invention relates to an electroluminescent polymer and an organic electroluminescent device using the same, and more particularly, to an electroluminescent polymer including a polycyclicamine unit in its polyarylene backbone and an organic electroluminescent device using the same that offers high luminance and efficiency.

2. Description of the Related Art

Since the report of a multi-layered organic electroluminescent device, each layer having a specific function, by C. W. Tang of Eastman Kodak company, due to its advantages of light weight, thinness, a wide range of colors, fast switching speed, and high luminescence at low driving voltage, a lot of research on organic electroluminescent devices has been conducted for the last decade. As a result of this research, great improvements in the performance of organic electroluminescent devices have been made in a short period of time. These improvements include balanced charge injection due to multi-layered structures, color tunability and higher quantum efficiency by doping, etc. In addition, new electrodes formed of specific alloys have been found to be suitable for organic electroluminescent devices.

Such organic electroluminescent devices can be classified according to the molecular weight of their materials and manufacturing processes. Organic electroluminescent devices can be manufactured from low molecular weight compounds and large molecular weight compounds. Low molecular weight compounds can be layered by vacuum deposition and can be easily purified to a high degree. In addition, color pixels can be easily obtained in a low molecular weight device. Despite these advantages of low molecular weight organic electroluminescent devices, they still require further improvements for practical application, for example, in quantum efficiency and color purity, and there is a need to prevent crystallization of thin layers. Various studies on such electroluminescent displays using low molecular weight compounds have been actively undertaken, especially in Japan and the U.S.A. For example, Idemitsu-Kosan Co., Ltd. of Japan first exhibited in 1997 a 10-inch full color organic electroluminescent display using a color-changing medium. Pioneer Corporation of Japan presented a 5-inch passive matrix (PM) full color organic electroluminescent display. Recently, Pioneer Corporation and Motorola Inc. have arrived at an agreement concerning the mass production of cellular phones having organic electroluminescent displays, implying that low molecular weight electroluminescent displays will be commercially viable in the near future.

Research on electroluminescent devices using polymers has been accelerated since the Cambridge Group's report in 1990 on the ability of poly (1,4-phenylene vinylene) (PPV), π-conjugated polymer, to emit light when exposed to electricity. π-conjugated polymers have an alternating structure of single bonds (σ-bonds) and double bonds (π-bonds), where π-electrons are evenly distributed to move freely in the polymer chain. Accordingly, π-conjugated polymers have semiconductor properties and can emit light of a visible range corresponding to the HOMO-LUMO energy bandgap, via proper molecular designing, when applied to an emissive layer of an electroluminescent device. Such a polymer can be easily formed as a thin layer in the manufacture of electroluminescent devices by spin coating or printing, at low costs and has a high glass transition temperature that allows the thin layer to have good mechanical properties. Thus, such polymer-based electroluminescent devices are expected to be more commercially competitive than low molecular weight electroluminescent devices in the near future.

However, electroluminescent devices using polymers have problems of low color purity, high driving voltage, low efficiency, etc. Research has been actively conducted to address the problems of polymer-based electroluminescent devices. As an example, copolymerization (U.S. Pat. No. 6,169,163) or blending (Synthetic Metal, Vol. 106, pp. 115-119, 1999) of a fluorene-containing polymer was suggested for improved electroluminescent properties. However, improvements are still required.

SUMMARY OF THE INVENTION

The present invention provides an electroluminescent polymer with improved emission properties and stability that includes a polycyclicamine unit offering high charge mobility and that can emit blue light in its polyarylene backbone.

The present invention also provides an organic electroluminescent device with an organic layer formed from the electroluminescent polymer.

According to an aspect of the present invention, there is provided an electroluminescent polymer, including: 1 through 99 mole % of a repeating unit represented by Formula (1) below; and 99 through 1 mole % of a repeating unit represented by Formula (2) below:

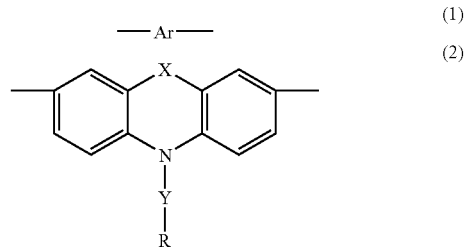

where Ar is a $C_{6-26}$ aromatic group or a $C_{4-20}$ heteroaromatic group including at least one heteroatom in the aromatic ring, where the aromatic group or the heteroaromatic group is unsubstituted or substituted with at least one of a $C_{1-12}$ alkyl group, a $C_{1-12}$ alkoxy group, and —N(R')(R") where R' and R" are each independently a hydrogen atom or a $C_{1-12}$ alkyl group;

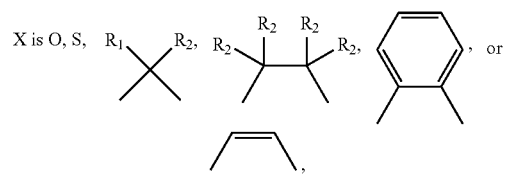

where $R_1$ and $R_2$ are each independently a hydrogen atom, a $C_{1-12}$ linear alkyl group, a $C_{1-12}$ branched alkyl group or a $C_{1-12}$ alkoxy group; Y is phenylene, naphthalene or anthracene, but Y is not phenylene when X is O, S or $CH_2$; and R is a hydrogen atom, a $C_{1-12}$ linear alkyl group, a $C_{1-12}$ branched alkyl group, a $C_{1-12}$ alkoxy group or a $C_{5-30}$ cycloalkyl group, or a $C_{6-14}$ aromatic group which is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group, the polymer having a degree of polymerization in the range of 10 to 2,000.

According to another aspect of the present invention, there is provided an organic electroluminescent device including an organic layer between a pair of electrodes, the organic layer containing the above-mentioned electroluminescent polymer.

According to yet another aspect of the present invention, there is provided an organic electroluminescent device including an organic layer between a first electrode and a second electrode, the organic layer including an emissive layer and a hole transport layer between the emissive layer and the second electrode, at least one of the emissive layer and the hole transport layer containing the above-mentioned electroluminescent polymer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown.

An embodiment of the present invention provides an electroluminescent polymer, having a degree of polymerization in the range of 10 to 2,000, including: 1 through 99 mole % of a repeating unit represented by Formula (1) below; and 99 through 1 mole % of a repeating unit represented by Formula (2) below:

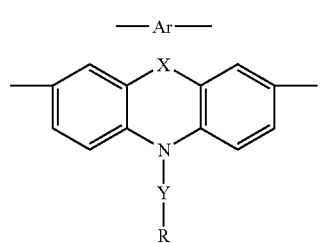

(1)
(2)

where Ar is a $C_{6-26}$ aromatic group or a $C_{4-20}$ heteroaromatic group including at least one heteroatom in the aromatic ring, where the aromatic group or the heteroaromatic group is unsubstituted or substituted with at least one of a $C_{1-12}$ alkyl group, a $C_{1-12}$ alkoxy group, and —N(R')(R") where R' and R" are each independently a hydrogen atom or a $C_{1-12}$ alkyl group;

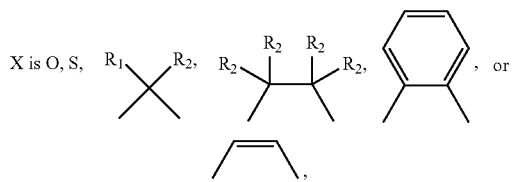

where $R_1$ and $R_2$ are hydrogen atoms, $C_{1-12}$ linear alkyl groups, $C_{1-12}$ branched alkyl groups or $C_{1-12}$ alkoxy groups;

Y is phenylene, naphthalene or anthracene, but Y is not phenylene when X is O, S or $CH_2$; and R is a hydrogen atom, a $C_{1-12}$ linear alkyl group, a $C_{1-12}$ branched alkyl group, a $C_{1-12}$ alkoxy group or a $C_{5-30}$ cycloalkyl group, or a $C_{6-14}$ aromatic group which is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group.

In the current embodiment of the present invention, the electroluminescent polymer may further include 1 through 99 mole % of a repeating unit represented by Formula (3) below:

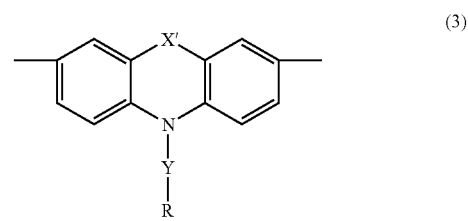

(3)

where X' is O or S; and Y and R are as described above.

According to the current embodiment of the present invention, polycyclicamine monomers which offer high charge mobility and are able to emit blue light are incorporated into the polyarylene backbone by copolymerization with arylene monomers to improve the blue electroluminescent property of a final polymer product.

According to the current embodiment of the present invention, the Ar unit may have a structure selected from the group consisting of Formulas (1a) through (1aa) below, and preferably Formula 1o, 1q or 1r:

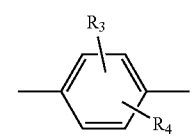

(1a)

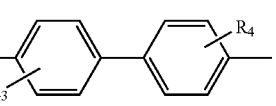

(1b)

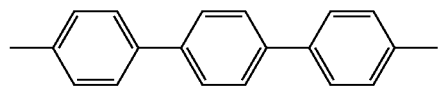

(1c)

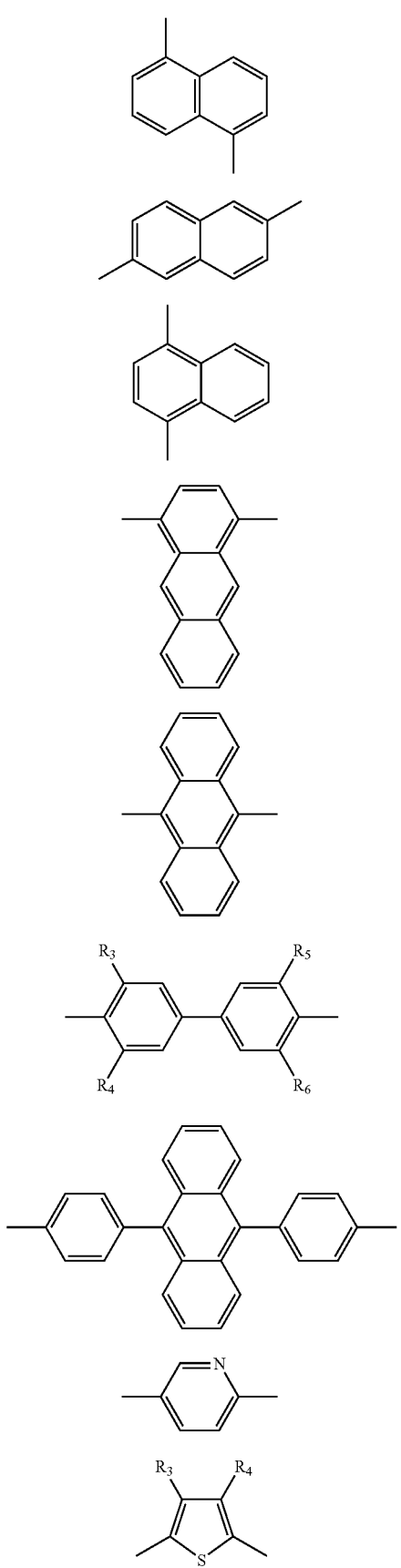

-continued

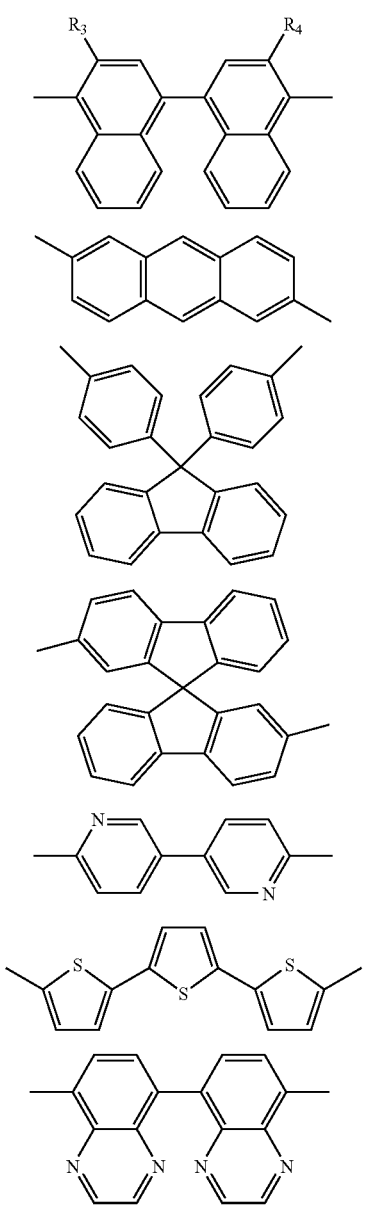

where $R_3$, $R_4$, $R_5$, and $R_6$ are each independently hydrogen, a $C_{1-12}$ alkyl group, a $C_{1-12}$ alkoxy group, a $C_{6-20}$ alkyl group or —N(R')(R") where R' and R" are each independently a hydrogen atom or a $C_{1-12}$ alkyl group.

A fluorene structure exhibits more fluorescence than other aromatic structures and greater chemical flexibility due to soluble moiety at the 9-9' position that is highly likely to accept various substituents, including an alkyl group. This is the reason why the fluorene structure is preferable for the arylene unit.

Figure 2A:
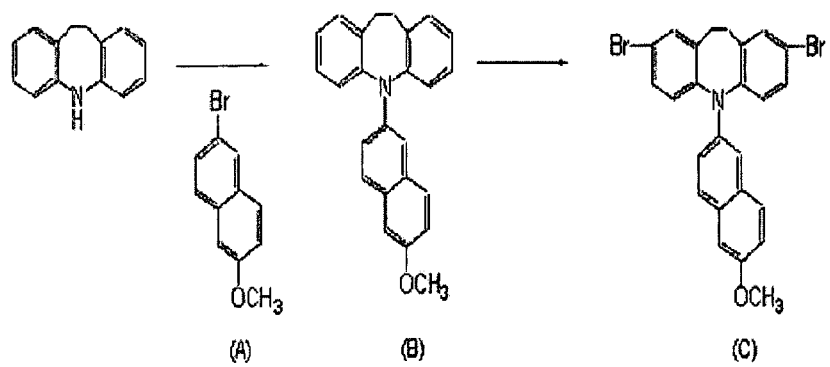
FIG. 2A is a reaction scheme illustrating the synthesis of poly(2',3',6',7' tetraoctyloxyspirofluorene-co-iminodibenzyl) of formula (4) according to an embodiment of the present invention.
Figure 2A:
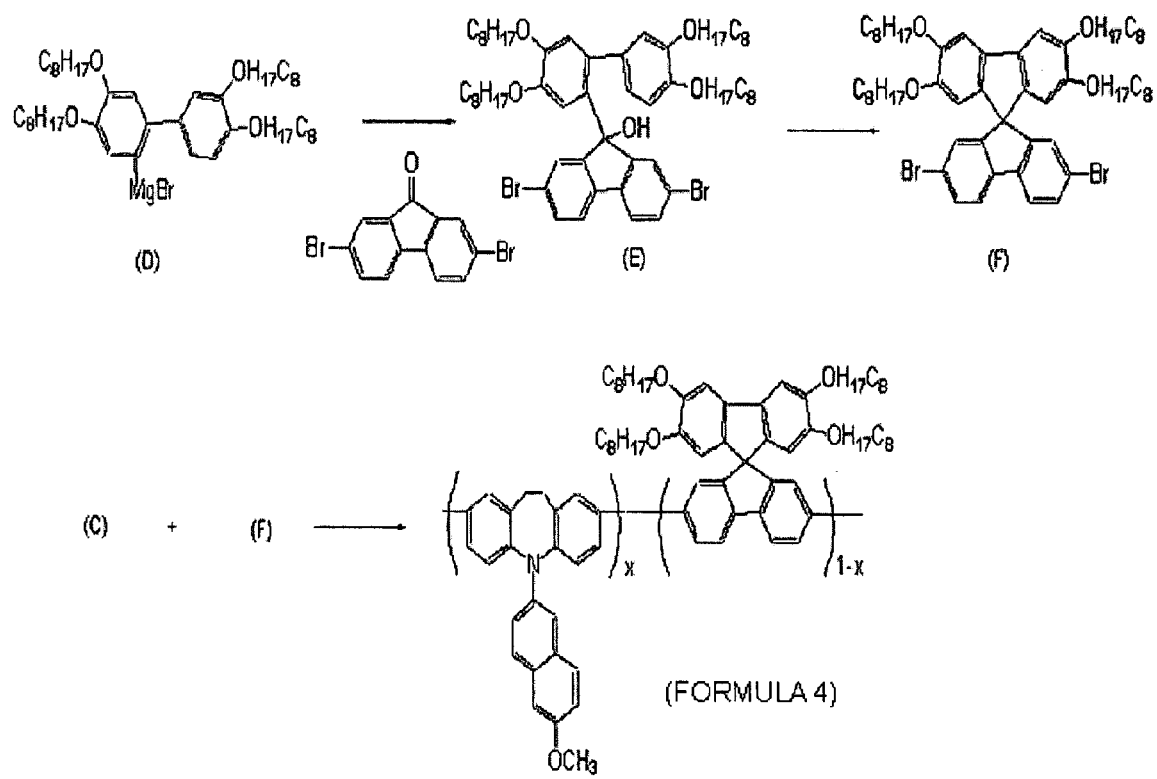
Figure 2B:
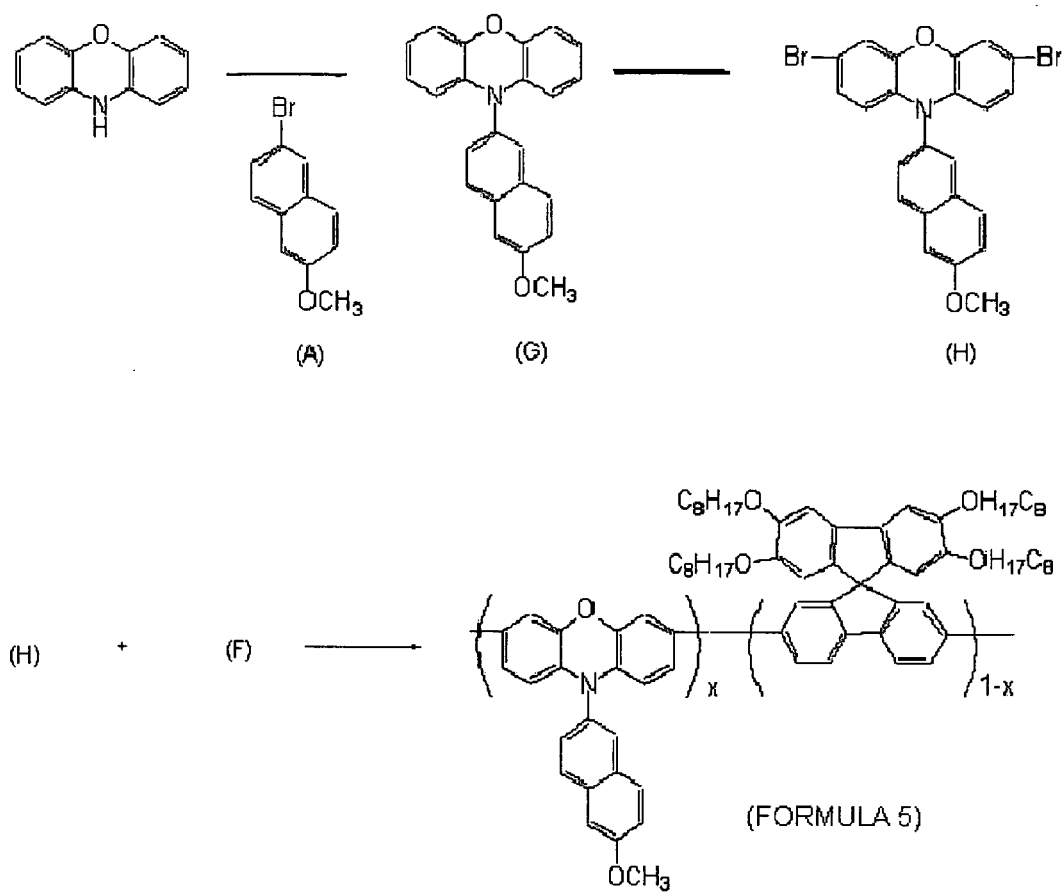
FIG. 2B is a reaction scheme illustrating the synthesis of poly(2',3',6',7' tetraoctyloxyspirofluorene-co-phenoxazine) of formula (5) according to an embodiment of the present invention.
Figure 2C:
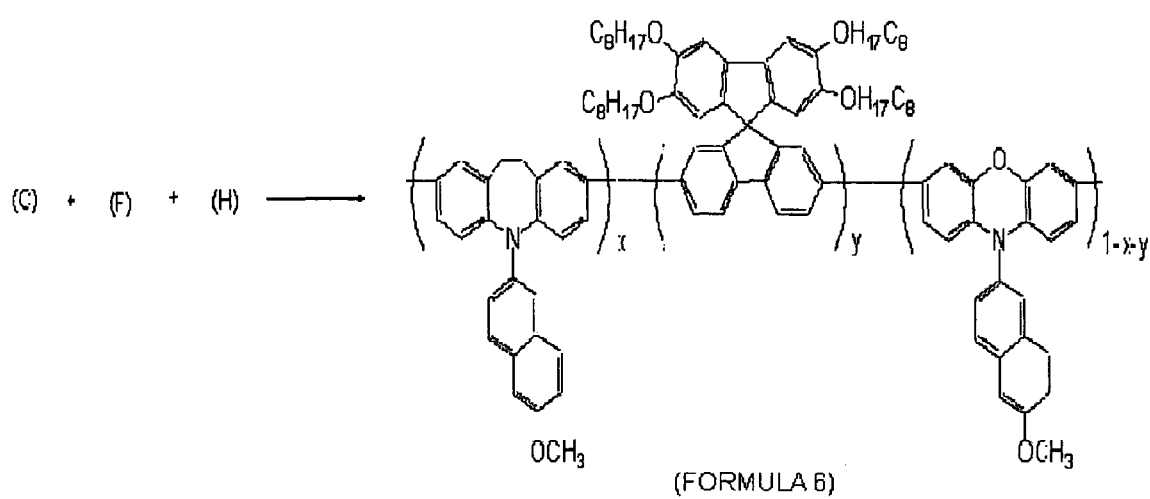
FIG. 2C is a reaction scheme illustrating the synthesis of poly(2',3',6',7' tetraoctyloxyspirofluorene-co-iminodibenzyl-phenoxazine) of formula (6) according to an embodiment of the present invention.

FIGS. 2A through 2C illustrates reaction schemes illustrating the synthesis of electroluminescent polymers from arylene (Ar) units, 2',3',6',7'-tetraoctyloxyspirofluorene according to embodiments of the present invention.

It is preferable that an electroluminescent polymer according to an embodiment of the present invention has a weight average molecular weight of 10,000-2,000,000. The weight average molecular weight of the electroluminescent polymer affects thin film formation and the lifetime of an electroluminescent device manufactured from the polymer. If the electroluminescent polymer has a weight average molecular weight less than 10,000, crystallization is likely to occur in the manufacture and the driving of a device. On the other hand, it is impractical to obtain an electroluminescent polymer having a weight average molecular weight greater than 2,000,000 via a Pd(0) or Ni(0)-mediated aryl coupling reaction.

A narrower molecular weight distribution (MWD) of an electroluminescent polymer is known to be advantageous in various aspects, especially for the longer lifetime of a device. The electroluminescent polymer according to an embodiment of the present invention has a MWD of 1.5 to 5.

It is preferable that an electroluminescent polymer according to an embodiment of the present invention is represented by Formulas (4) through (6) below:

(4)

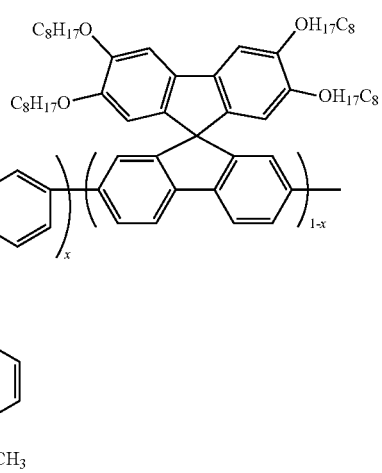

In Formula (4), x is a real number ranging from 0.01 to 0.99, preferably, from 0.01 to 0.20.

(5)

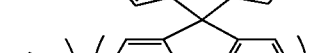

In Formula (5), x is a real number ranging from 0.01 to 0.99, preferably, from 0.01 to 0.20.

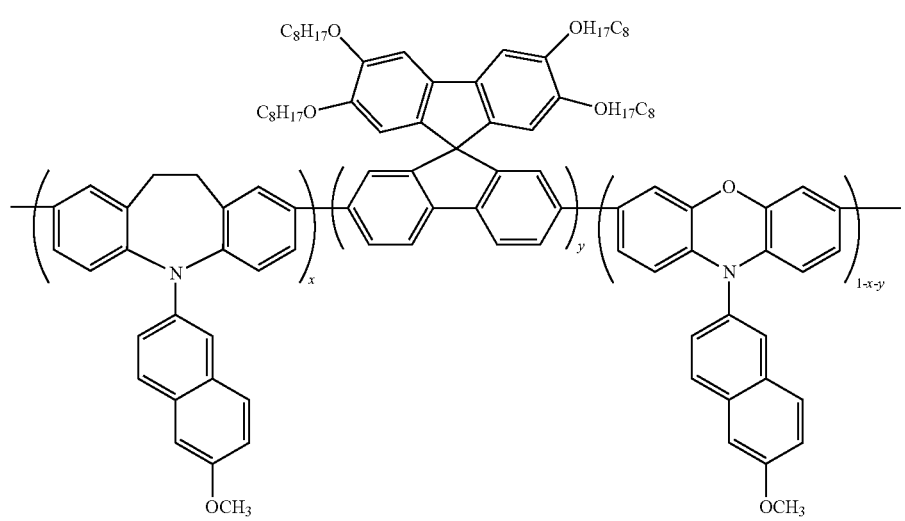

(6)

In Formula (6), x is a real number ranging from 0.01 to 0.99, preferably, from 0.01 to 0.20.

Examples of an unsubstituted alkyl group used as a substituent in the current embodiment of the present invention may include methyl, ethyl, propyl, isobutyl, sec-butyl, tert-butyl, pentyl, iso-amyl, hexyl, etc. At least one hydrogen atom from the alkyl group may be substituted with a halogen atom, a hydroxyl group, a nitro group, a cyano group, a substituted or unsubstituted amino group (—N(R')(R'') where R' and R'' are each independently a hydrogen atom or a $C_{1-12}$ alkyl group), an amidino group, a hydrazine group, a hydrazon group, a carboxyl group, a sulfonic acid group, a phosphoric acid group, a $C_{1-20}$ alkyl group, a $C_{1-20}$ alkyl halide group, a $C_{1-20}$ alkenyl group, a $C_{1-20}$ alkynyl group, a $C_{1-20}$ heteroalkyl group, a $C_{5-30}$ aryl group, a $C_{5-30}$ arylalkyl group, a $C_{5-30}$ heteroaryl group, or a $C_{5-30}$ heteroarylalkyl group.

An aryl group, used as a substituent in the compound of the current embodiment of the present invention, has a carbocycle aromatic structure containing at least one aromatic ring, wherein the aromatic rings may adhere together using a pendant or be fused. The aryl group, for example, may be an aromatic group, such as phenyl, naphthyl, tetrahydronaphthyl, etc. As in the case of the alkyl group, at least one hydrogen atom of the aryl group may be substituted with a substituent.

A heteroaryl group, used as a substituent in the compound of the current embodiment of the present invention, includes 1, 2, or 3 hetero atoms selected from the group consisting of N, O, P, and S. Also, the heteroaryl group has an aromatic ring structure having 5-30 ring atoms, wherein the rest of the ring atoms are carbon atoms. The ring atoms may adhere together using a pendant or be fused. As in the case of the $C_{1-30}$ alkyl group, at least one hydrogen atom of the heteroaryl group may be substituted with a substituent.

An alkoxy group, used as a substituent in the compound of the current embodiment of the present invention is a radical-O-alkyl group, wherein the alkyl group is the same as described above. Examples of the alkoxy group include methoxy, ethoxy, propoxy, isobutyloxy, sec-butyloxy, pentyloxy, iso-amyloxy, hexyloxy, etc., and as in the case of the alkyl group, at least one hydrogen atom of the alkoxy group may be substituted with a substituent.

An arylalkyl group, used as a substituent in the compound of the current embodiment of the present invention, is formed by substituting one or more of a plurality of hydrogen atoms of the above described aryl group with lower alkyl, such as methyl, ethyl, propyl, etc. Examples of the arylalkyl group include benzyl, phenylethyl, etc. As in the case of the alkyl group, at least one hydrogen atom of the arylalkyl group may be substituted with a substituent.

A heteroarylalkyl group, used in the compound of the current embodiment of the present invention, is formed by substituting one or more a plurality of hydrogen atoms of the heteroaryl group with lower alkyl, wherein the heteroaryl group of the heteroarylalkyl group is the same as described above. As in the case of the alkyl group, at least one hydrogen atom of the heteroarylalkyl group may be substituted with a substituent.

An aryloxy group used in the compound of the current embodiment of the present invention is a radical-O-aryl, wherein the aryl is the same as described above. Examples of the aryloxy group include phenoxy, naphthoxy, anthracenyloxy, phenanthrenyloxy, fluorenyloxy, indenyloxy, etc. As in the case of the $C_{1-30}$ alkyl group, at least one hydrogen atom of the aryloxy group may be substituted with a substituent.

A heteroaryloxy group used in the compound of the current embodiment of the present invention is a radical-O-heteroaryl, wherein the heteroaryl is the same as described above.

Examples of the heteroaryloxy group include a benzyloxy group, a phenylethyloxy group, etc. and as in the case of the $C_{1-30}$ alkyl group, at least one hydrogen atom of the heteroaryloxy group may be substituted with a substituent.

A cycloalkyl group used in the compound of the current embodiment of the present invention has a monovalent monocyclic structure having 5-30 carbon atoms. As in the case of the $C_{1-30}$ alkyl group, at least one hydrogen atom of the cycloalkyl group may be substituted with a substituent.

A heterocycloalkyl group, used in the compound of the current embodiment of the present invention, includes 1, 2, or 3 hetero atoms selected from the group consisting of N, O, P, and S. Also, the heterocycloalkyl group has a monovalent monocyclic structure having 5-30 ring atoms, wherein the rest of the ring atoms are carbon. As in the case of the alkyl group, at least one hydrogen atom of the cycloalkyl group may be substituted with a substituent.

An amino group used in the compound of the current embodiment of the present invention is —N(R')(R''), where R' and R'' are independently a hydrogen atom or a $C_{1-12}$ alkyl group.

Hereinafter, an organic electroluminescent device employing the polymer having the repeating units according to the above described Formulas 1 and 2 of the present invention will be described.

FIGS. 1A through 1F are schematic views of structures of organic electroluminescent devices according to embodiments of the present invention.

Figure 1A:
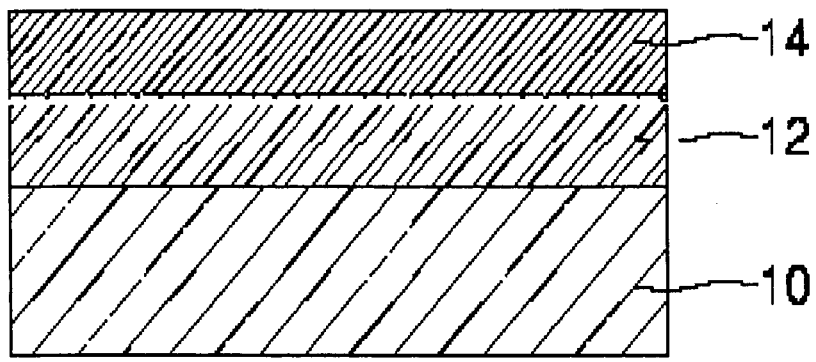
FIGS. 1A through 1F are cross-sectional views of structures of organic electroluminescent devices according to embodiments of the present invention.

In FIG. 1A, an emissive layer 12 containing the electroluminescent polymer is formed on a first electrode 10 and a second electrode 14 is formed on the emissive layer 12.

Figure 1B:
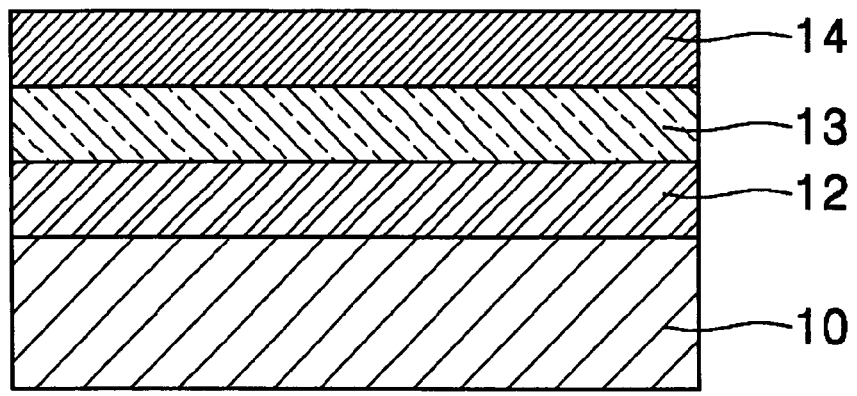

In FIG. 1B, an emissive layer 12 containing the electroluminescent polymer is formed on a first electrode 10, a hole blocking layer 13 is formed on the emissive layer 12, and a second electrode 14 is formed on the hole blocking layer 13.

Figure 1C:
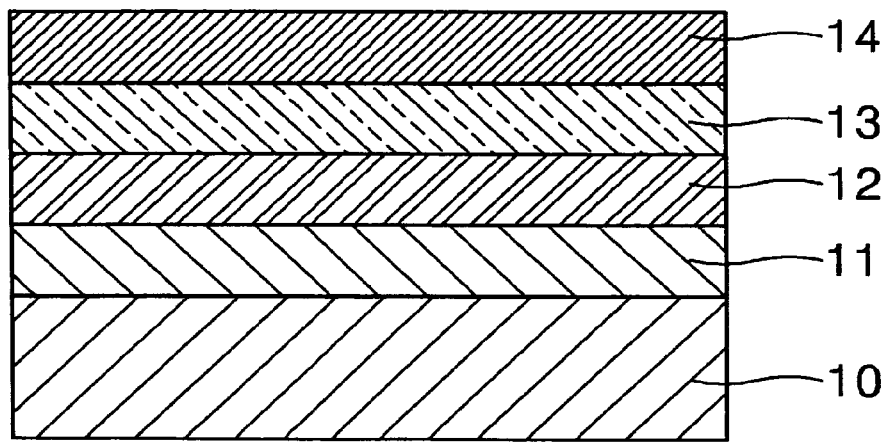

In FIG. 1C, an organic electroluminescent device is manufactured in the same manner as in FIG. 1B, except that a hole injection layer 11 (or also called a buffer layer) is formed between the first electrode 10 and the emissive layer 12.

Figure 1D:
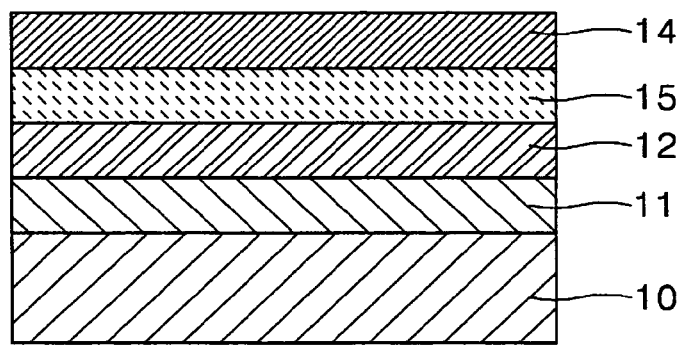

In FIG. 1D, an organic electroluminescent device has the same structure as in FIG. 1C, except that an electron transport layer 15 is formed on the emissive layer 12 instead of the hole blocking layer 13.

Figure 1E:
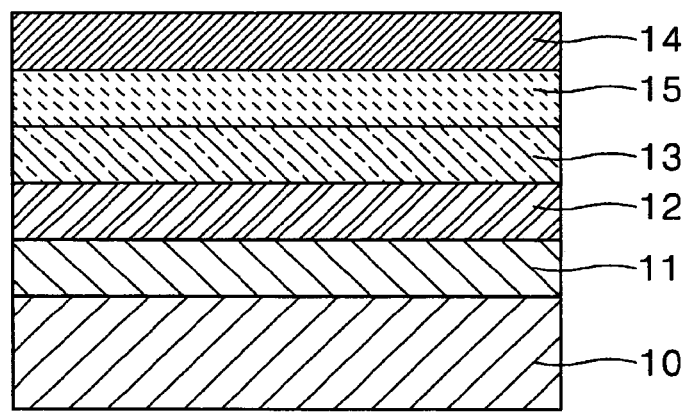

In FIG. 1E, an organic electroluminescent device has the same structure as in FIG. 1C, except that an electron transport layer 15 is formed on the hole-blocking layer 13.

Figure 1F:
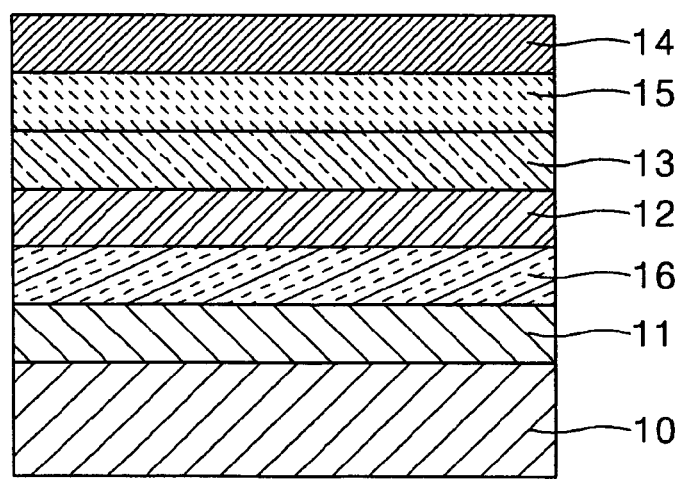

In FIG. 1F, an organic electroluminescent device has the same structure as in FIG. 1E, except that a hole transport layer 16 is additionally formed between the hole injection layer 11 and the emissive layer 12. The hole transport layer 16 prevents impurities from penetrating from the hole injection layer 11 into the emissive layer 12.

The organic electroluminescent devices having the structures of FIGS. 1A through 1F according to embodiments of the present invention can be manufactured using conventional methods, and is not limited thereto.

A method of manufacturing an organic electroluminescent device according to an embodiment of the present invention will now be described.

A patterned first electrode 10 is formed on a substrate (not shown). The substrate may be a substrate used in a conventional organic electroluminescent device, preferably a glass substrate or a transparent plastic substrate having transparent and waterproof properties, a smooth surface, and which is easy to handle. The thickness of the substrate may be in the range of 0.3 to 1.1 mm.

Materials used to form the first electrode 10 are not specifically limited. When the first electrode 10 is an anode, the anode is formed of a conductive metal or an oxide thereof for easy hole injection. As an example, indium tin oxide, indium zinc oxide, nickel, platinum, aurum, iridium, etc. may be used.

The substrate, on which the first electrode 10 is formed, is washed and treated with UV/ozone. At this time, an organic solvent, such as isopropanol, acetone, etc. is used for the washing.

On the first electrode 10, a hole injection layer 11 is selectively formed. When the hole injection layer 11 is formed, a contact resistance between the first electrode 10 and the emissive layer 12 is reduced and the hole transport capability between the first electrode 10 to the emissive layer 12 is improved. Hence the organic electroluminescent device of the present invention can have low driving voltage and long lifetime. The hole injection layer 11 may be formed of a conventionally-used material, such as poly(3,4-ethylenedioxythiophene)/polystyrene parasulfonate, starburst based material, copper phthalocyanine, polythiophene, polyaniline, polyacetylene, polypyrrole, polyphenylene vinylene, or derivatives thereof. The upper portion of the first electrode 10 is spin coated using such a material and dried to form the hole injection layer 11. Here, the thickness of the hole injection layer 11 is in the range of 300 to 2000 Å and preferably in the range of 500 to 1100 Å. When the thickness of the hole injection layer 11 is outside the above mentioned range, properties of the hole injection layer 11 deteriorate. The drying temperature of the first electrode 10 when forming the hole injection layer 11 may be in the range of 100 to 250° C.

An emissive layer 12 is formed by coating the upper portion of the hole injection layer 11 with a composition for forming the emissive layer using a spin coating method, etc. and drying the coated hole injection layer 11. Here, the composition for forming an emissive layer may be formed of a polymer in 0.5-20% of weight and a solvent in 99.5-80% of weight, both containing the repeating units of Formulas (1) and (2).

Any solvent that can dissolve an emissive polymer may be used, and examples of this solvent include toluene, chlorobenzene, xylene, etc.

In some cases, the composition for forming an emissive layer may further include a dopant. The amount of the dopant may differ based on a material used to form an emissive layer, but it may be in the range of 30 to 80 parts by weight based on 100 parts by weight of the material (weight of the host and the dopant.) If the amount of the dopant is outside the above range, emissive properties of the electroluminescent device deteriorate. The dopant, for example, may be formed of arylamine, a peryl based compound, a pyrrole based compound, a hydrazone based compound, a carbazole based compound, a stilbene based compound, a starburst based compound, an oxadiazole based compound, etc.

The thickness of the emissive layer 12 may be controlled by regulating the density of the compound for forming an emissive layer and the rotating speed while spin coating. The thickness of the emissive layer 12 may be in the range of 100 to 1000 Å, and preferably in the range of 500 to 1000 Å. When the thickness of the emissive layer 12 is less than 100 Å, emissive efficiency deteriorates. When the thickness of the emissive layer 12 is greater than 1000 Å, driving voltage increases.

A hole transport layer 16 may be selectively formed between the hole injection layer 11 and the emissive layer 12. Any material having hole transport properties may be used to form the hole transport layer 16. An example of such a material is polytriphenylamine, etc. The thickness of the hole transport layer 16 may be in the range of 100 to 1,000 Å.

A hole blocking layer 13 and/or an electron transport layer 15 are formed on the upper portion of the emissive layer 12 using deposition or spin coating. The hole blocking layer 13 prevents excitons formed from the emissive material from moving to the electron transport layer 15 or holes from moving to the electron transport layer 15.

The hole blocking layer 13 may be formed of LiF, $BaF_2$ or $MgF_2$, a phenanthroline based compound (e.g.: BCP available from UDC), an imidazole based compound, a triazole based compound, an oxadiazole based compound (e.g.: PBD), aluminum complex (available from UDC), or BAlq having the below formulas, etc.

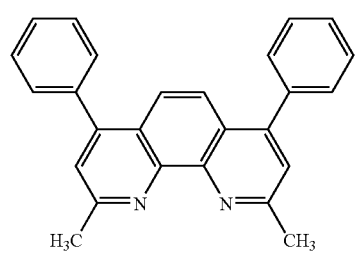

Organic compound
containing phenanthroline

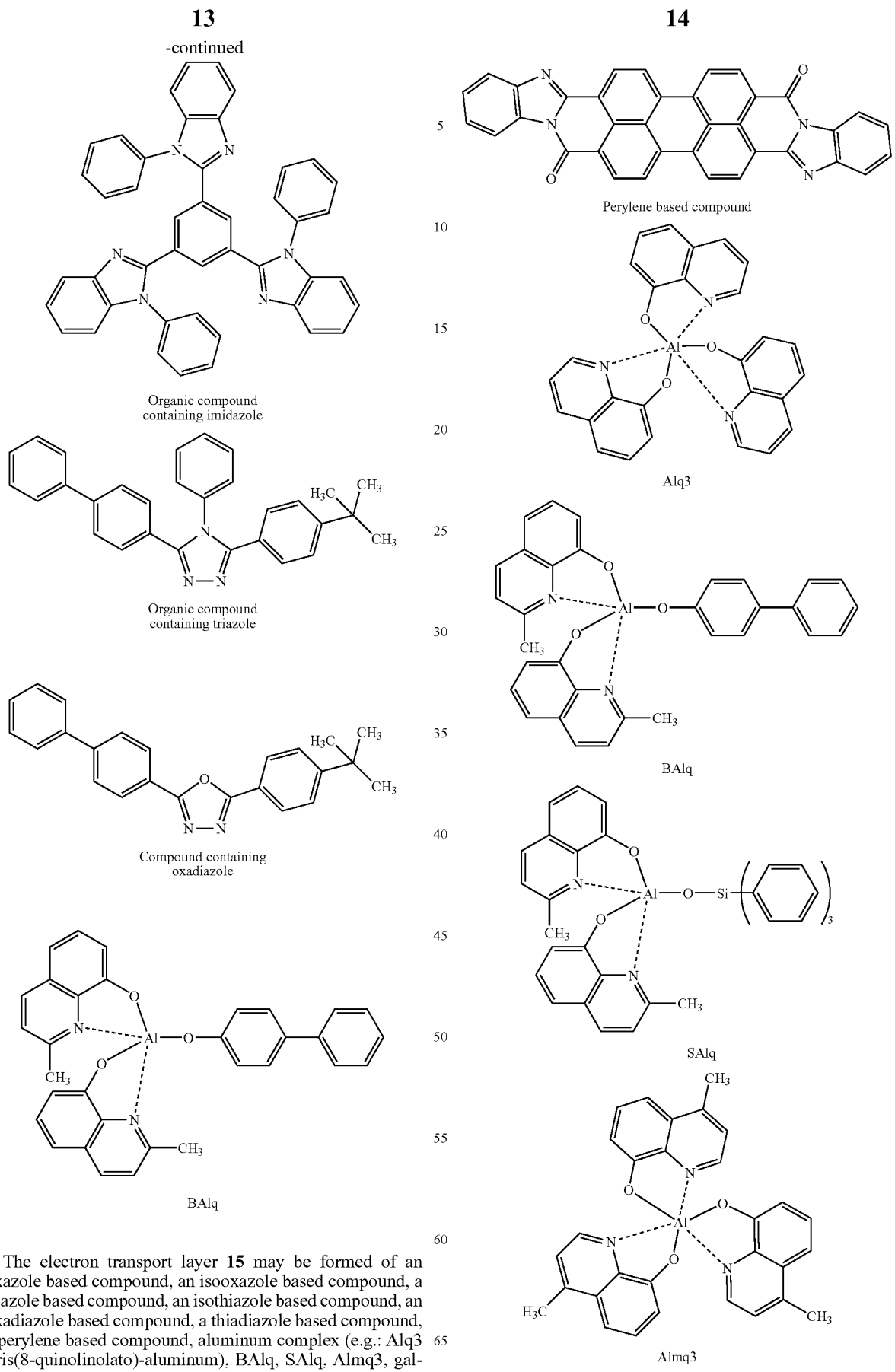

The electron transport layer 15 may be formed of an oxazole based compound, an isooxazole based compound, a triazole based compound, an isothiazole based compound, an oxadiazole based compound, a thiadiazole based compound, a perylene based compound, aluminum complex (e.g.: Alq3 (tris(8-quinolinolato)-aluminum), BAlq, SAlq, Almq3, gallium complex (e.g: Gaq'2OPiv, Gaq'2OAc, 2(Gaq'2)), etc.

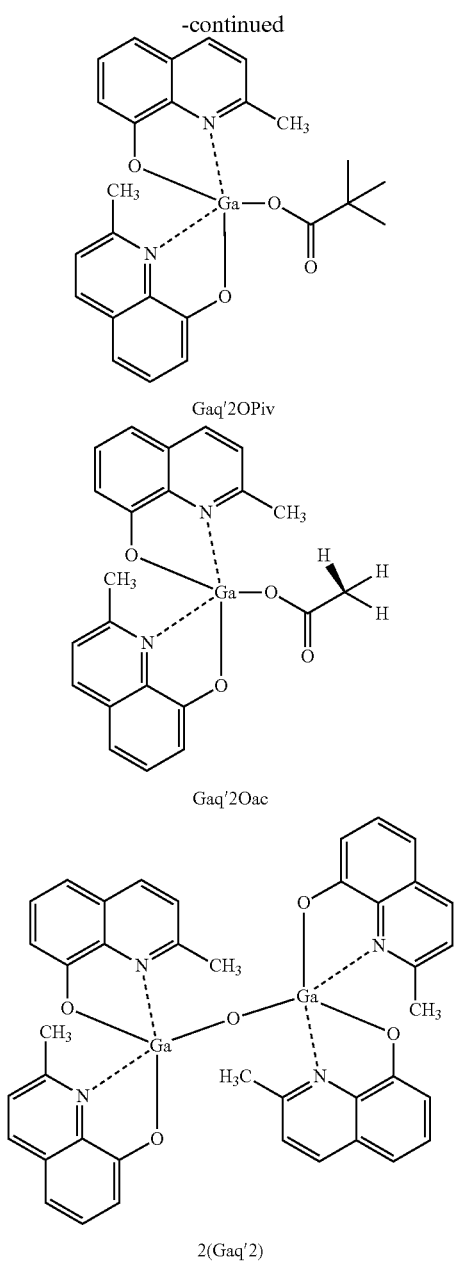

Gaq'2OPiv

Gaq'2Oac

2(Gaq'2)

The thickness of the hole blocking layer 13 may be in the range of 100 to 1,000 Å, and the thickness of the electron transport layer 15 may be in the range of 100 to 1,000 Å. If the thicknesses of the hole blocking layer 13 and the electron transport layer 15 are outside the above ranges, the properties of the hole blocking layer 13 and the electron transport layer 15 respectively deteriorate.

Subsequently, a second electrode 14 is formed on the above product, and the final product is soldered to complete an organic electroluminescent device.

The material used to form the second electrode 14 is not specifically limited, and the second electrode 14 may be formed by depositing a metal having a small work function, such as Li, Ca, Ca/Al, LiF/Ca, BaF$_2$/Ca, LiF/Al, Al, Mg, or Mg ally. The thickness of the second electrode 14 may be in the range of 50 to 3,000 Å.

The polymer of Formula (1) according to an embodiment of the present invention is used as a material to form an emissive layer while manufacturing the organic electrolumi-nescent device, but due to its chemical properties, it may also be used as a material to form a hole transport layer. Also, the polymer may be used as an intermediate in bio-field.

The method of preparing an organic electroluminescent device according to the current embodiment of the present invention does not require a special apparatus, and the organic electroluminescent device may be manufactured using a conventional method of manufacturing an organic electroluminescent device using an emissive polymer.

The present invention will be described in greater detail with reference to the following examples. The following examples are for illustrative purposes and are not intended to limit the scope of the invention.

Preparation Example 1

Preparation of an Iminodibenzyl Monomer (Compound (C) of FIG. 2A)

Preparation of Compound (B)

7.5 g (32 mmol) of 2-bromo-6-methoxynaphthalene (Compound (A) of FIG. 2A), 4.8 g (25 mmol) of iminodibenzyl, 3.7 g (38 mmol) of sodium tert-butoxide, 0.3 g (0.33 mmol) of Pd(dba)$_2$ [Tris(dibenzylidene acetone)dipalladium (0)], and 0.11 g (0.55 mmol) of tri(tert-butyl)phosphine were dissolved in 125 ml of toluene and reacted at 80° C. for 12 hours.

After the reaction was completed, the reaction mixture was cooled to room temperature, and 200 ml of distilled water was added to quench the reaction mixture. A 1:1 mixture of xylene and water by volume was extracted from the reaction mixture. The organic layers were dried using MgSO$_4$, concentrated, and subjected to silica gel column chromatography using a 1:2 mixture of toluene and hexane by volume as an eluent. A resulting eluate was concentrated and dried to provide 7.6 g of Compound (B) with a yield of 87%. The structure of Compound (B) was identified through $^1$H-NMR.

2) Preparation of Compound (C)

2.1 gram equivalent of bromine was slowly added to a solution of 3.51 g (10 mmol) of Compound (B) in 150 ml of CHCl$_3$ at a temperature of 0° C. When the complete consumption of the starting material was confirmed through TLC, addition of bromine was stopped, and the reaction mixture was stirred for 10 min.

Next, a small amount of acetone was added to the reaction mixture to quench the bromine, followed by extraction using a 2:1 mixture of water and CHCl$_3$ by volume. The organic layers were dried using MgSO$_4$, concentrated, and reprecipitated in methanol to provide 4.7 g of Compound (C) with a yield of 90%. The structure of Compound (C) was identified through $^1$H-NMR.

$^1$H-NMR (300 MHz, CDCl$_3$): δ7.44 (d, 2H), δ7.04 (dd, 2H), δ7.00 (d, 2H), δ6.85 (s, 2H), δ6.76 (s, 2H), δ6.30 (m, 2H), δ3.85 (m, 3H), δ2.88 (m, 4H)

Preparation Example 2

Preparation of 2,7-dibromo-2',3',6',7'-dioctylox-yspirofluorene (Compound (F) of FIG. 2A)

1) Preparation of Compound (E)

8.45 g (11 mmol) of Compound (D) of FIG. 2A in 50 ml of ether was added to a solution of 3.36 g (10 mmol) of 2,7-dibromo-9-fluorenone in 50 ml of ether, and stirred at reflux overnight. After the reaction was completed, the reaction product was cooled, filtered to give yellow powder, and washed three times with ether. Ammonium chloride was added to the product, stirred for 10 hours, and filtered. The filter cake was washed with water three times, followed by recrystallization in ethanol to provide a yellow solid Compound (E) with a yield of 83%.

2) Preparation of Compound (F)

5.0 g (5 mmol) of Compound (E) was added to 15 ml of $CH_3COOH$ and gently stirred at reflux, and 0.5 ml of hydrochloric acid was added to the reaction mixture and refluxed for 1 hour. After the reaction was completed, the reaction product was cooled to room temperature and filtered. The filter cake was washed with water three times, followed by recrystallization in ethanol to provide 1.42 g (1.44 mmol) of white powdery Compound (F) with a yield of 29%. The structure of Compound (G) was identified through $^1$H-NMR.

$^1$H-NMR (300 MHz, $CDCl_3$): δ7.60 (d, 2H), δ7.43 (dd, 2H), δ7.16 (d, 2H), δ6.79 (s, 2H), δ6.20 (s, 2H), δ4.18 (m, 4H), δ3.75 (m, 4H), δ1.94 (m, 8H), δ1.72 (m, 8H), δ1.30 (m, 32H), δ0.96 (m, 12H)

Example 1

Preparation of poly(2',3',6',7'-tetraoctyloxy spirofluorene-co-iminodibenzyl) in a Mole Ratio of 90:10 [NTSID9] of Formula (4) of FIG. 2A A Schlenk flask was fully evacuated and refluxed with nitrogen gas to completely remove moisture. 330 mg (1.2 mmol) of $Ni(COD)_2$ and 187 mg (1.2 mmol) of bipyridal were injected into the Schlenk flask in a glove box. Next, the flask was fully evacuated again and refluxed with nitrogen gas. 5 ml of anhydrous dimethyl formamide (DMF), 0.13 ml (1.2 mmol) of 1,5-cyclooctadiene (COD), and 5 ml of anhydrous toluene were added to the flask under nitrogen atmosphere. The reaction mixture was stirred at 80° C. for 30 min, a diluted solution of 20 mg (0.04 mmol) of Compound (C) prepared in Preparation Example 1 and 0.335 g (0.36 mmol) of Compound (F), i.e., 2,7-dibromo-2',3',6',7'-dioctyloxyspirofluorene, prepared in Preparation Example 2 in 10 ml of toluene was added and stirred. After 20 min., 0.1 ml of bromopentafluorobenzene was added to the mixture and stirred at 80° C. for 1 day.

After the reaction was completed, the temperature of the reaction mixture was dropped to 60° C., and the reaction mixture was poured into a 1:1:2 mixture of HCl, acetone, and methanol by volume to precipitate. The precipitates were dissolved in chloroform, reprecipitated in methanol, and subjected to Soxhlet extraction to give 250 mg of poly(2',3',6',7'-tetraoctyloxy spirofluorene-co-iminodibenzyl) in a mole ratio of 90:10 with a yield of 60%. As a result of gel permeation chromatography (GPC), the weight average molecular weight (Mw) was 89,000, and the molecular weight distribution (MWD) was 1.57.

Preparation Example 3

Preparation of a Phenoxazine Monomer (Compound (H) of FIG. 2B)

1) Preparation of Compound (G)

7.5 g (32 mmol) of 2-bromo-6-methoxynaphthalene, 4.6 g (25 mmol) of penoxazine, 3.7 g (38 mmol) of sodium tert-butoxide, 0.3 g (0.33 mmol) of $Pd(dba)_2$ [Tris(dibenzylidene acetone)dipalladium(0)], and 0.11 g (0.55 mmol) of tri(tert-butyl)phosphine were dissolved in 125 ml of toluene and reacted at 80° C. for 12 hours.

After the reaction was completed, the reaction mixture was cooled to room temperature, and 200 ml of distilled water was added to quench the reaction mixture. A 1:1 mixture of xylene and water by volume was extracted from the reaction mixture. The organic layers were dried using $MgSO_4$, concentrated, and subjected to silica gel column chromatography using a 1:2 mixture of toluene and hexane by volume as an eluent. A resulting eluate was concentrated and dried to provide 6.8 g of Compound (G) with a yield of 80%. The structure of Compound (B) was identified through $^1$H-NMR.

2) Preparation of Compound (H)

2.1 gram equivalent of bromine was slowly added to a solution of 3.39 g (10 mmol) of Compound (G) in 150 ml of $CHCl_3$ at a temperature of 0° C. When the complete consumption of the starting material was confirmed through TLC, addition of bromine was stopped, and the reaction mixture was stirred for 10 min.

Next, a small amount of acetone was added to the reaction mixture to quench bromine, followed by extraction using a 2:1 mixture of water and $CHCl_3$ by volume. The organic layers were dried using $MgSO_4$, concentrated, and reprecipitated in methanol to provide 4.2 g of Compound (H) with a yield of 85%. The structure of Compound (H) was identified through $^1$H-NMR.

$^1$H-NMR (300 MHz, $CDCl_3$): δ7.44 (d, 2H), δ6.95 (dd, 2H), δ6.90 (d, 2H), δ6.84 (s, 2H), δ6.76 (s, 2H), δ6.31 (m, 2H), δ3.73 (m, 3H).

Example 2

Preparation of poly(2',3',6',7'-tetraoctyloxy spirofluorene-co-phenoxazine) in a Mole Ratio of 90:10 [NTS9] of Formula (5) of FIG. 2B A Schlenk flask was fully evacuated and refluxed with nitrogen gas to completely remove moisture. 330 mg (1.2 mmol) of $Ni(COD)_2$ and 187 mg (1.2 mmol) of bipyridal were injected into the Schlenk flask in a glove box. Next, the flask was fully evacuated again and refluxed with nitrogen gas. 5 ml of anhydrous dimethyl formamide (DMF), 0.13 ml (1.2 mmol) of 1,5-cyclooctadiene (COD), and 5 ml of anhydrous toluene were added to the flask under nitrogen atmosphere. The reaction mixture was stirred at 80° C. for 30 min, a diluted solution of 20 mg (0.04 mmol) of Compound (H) prepared in Preparation Example 3 and 0.335 g (0.36 mmol) of Compound (F), i.e., 2,7-dibromo-2',3',6',7'-dioctyloxyspirofluorene, prepared in Preparation Example 2 in 10 ml of toluene was added and stirred. After 20 min., 0.1 ml of bromopentafluorobenzene was added to the mixture and stirred at 80° C. for 1 day.

After the reaction was completed, the temperature of the reaction mixture was dropped to 60° C., and the reaction mixture was poured into a 1:1:2 mixture of HCl, acetone, and methanol by volume to precipitate. The precipitates were dissolved in chloroform, reprecipitated in methanol, and subjected to Soxhlet extraction to give 300 mg of poly(2',3',6',7'-tetraoctyloxy spirofluorene-co-phenoxazine) in a mole ratio of 90:10 with a yield of 750%. As a result of gel permeation chromatography (GPC), the weight average molecular weight (Mw) was 300,000, and the molecular weight distribution (MWD) was 1.74.

Example 3

Preparation of poly(2',3',6',7'-tetraoctyloxy spirofluorene-co-iminodibenzyl-phenoxazine) in a Mole Ratio of 90:5:5 [NTS29] of Formula (6) of FIG. 2C A Schlenk flask was fully evacuated and refluxed with nitrogen gas to completely remove moisture. 330 mg (1.2 mmol) of $Ni(COD)_2$ and 187 mg (1.2 mmol) of bipyridal were injected into the Schlenk flask in a glove box. Next, the flask was fully evacuated again and refluxed with nitrogen gas. 5 ml of anhydrous dimethyl formamide (DMF), 0.13 ml (1.2 mmol) of 1,5-cyclooctadiene (COD), and 5 ml of anhydrous toluene were added to the flask under nitrogen atmosphere. The reaction mixture was stirred at 80° C. for 30 min, a diluted solution of 10 mg (0.02 mmol) of Compound (C) prepared in Preparation Example 1, 10 mg (0.02 mmol) of Compound (H) prepared in Preparation Example 3, and 0.335 g (0.36 mmol) of Compound (F), i.e., 2,7-dibromo-2',3',6',7'-dioctyloxyspirofluorene, prepared in Preparation Example 2 in 10 ml of toluene was added and stirred. After 20 min., 0.1 ml of bromopentafluorobenzene was added to the mixture and stirred at 80° C. for 1 day.

After the reaction was completed, the temperature of the reaction mixture was dropped to 60° C., and the reaction mixture was poured into a 1:1:2 mixture of HCl, acetone, and methanol by volume to precipitate. The precipitates were dissolved in chloroform, reprecipitated in methanol, and subjected to Soxhlet extraction to give 230 mg of poly(2',3',6',7'-tetraoctyloxyspirofluorene-co-iminodibenzyl-phenoxazine) in a mole ratio of 90:5:5 with a yield of 57%. As a result of gel permeation chromatography (GPC), the weight average molecular weight (Mw) was 73,000, and the molecular weight distribution (MWD) was 2.5.

Comparative Example 1

Preparation of poly(2',3',6',7'-tetraoctyl oxyspirofluorene)

A Schlenk flask was fully evacuated and refluxed with nitrogen gas to completely remove moisture. 330 mg (1.2 mmol) of Ni(COD)$_2$ and 187 mg (1.2 mmol) of bipyridal were injected into the Schlenk flask in a glove box. Next, the flask was fully evacuated again and refluxed with nitrogen gas. 5 ml of anhydrous dimethyl formamide (DMF), 0.13 ml (1.2 mmol) of 1,5-cyclooctadiene (COD), and 5 ml of anhydrous toluene were added to the flask under nitrogen atmosphere. The reaction mixture was stirred at 80° C. for 30 min, a diluted solution of 0.395 g (0.40 mmol) of Compound (F), i.e., 2,7-dibromo-2',3',6',7'-dioctyloxyspirofluorene, prepared in Preparation Example 2 in 10 ml of toluene was added and stirred. After 20 min., 0.1 ml of bromopentafluorobenzene was added to the mixture and stirred at 80° for 1 day.

After the reaction was completed, the temperature of the reaction mixture was dropped to 60° C., and the reaction mixture was poured into a 1:1:2 mixture of HCl, acetone, and methanol by volume to precipitate. The precipitates were dissolved in chloroform, reprecipitated in methanol, and subjected to Soxhlet extraction to give 290 mg of poly(2',3',6',7'-tetraoctyloxyspirofluorene) with a yield of 74%. As a result of gel permeation chromatography (GPC), the weight average molecular weight (Mw) was 360,000, and the molecular weight distribution (MWD) was 2.3.

Comparative Example 2

Preparation of poly(2',3',6',7'-tetraoctyl oxyspirofluorene-co-phenoxazine) in a Mole Ratio of 90:10 of Formula (7)

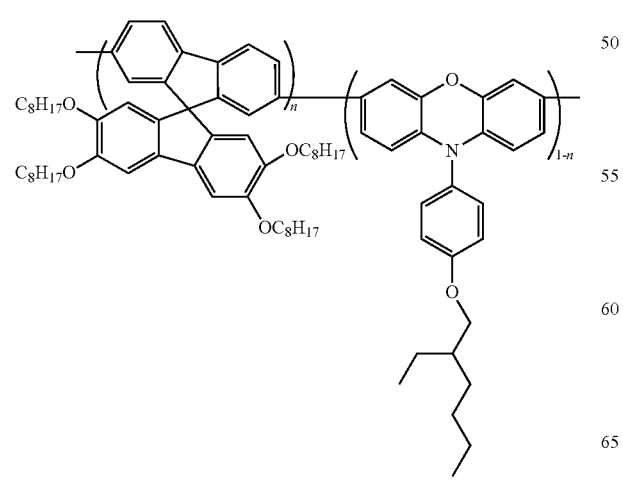

(7)

In Formula (7), n is 0.9.

Reaction processes of poly(2',3',6',7'-tetraoctyloxyspirofluorene-co-phenoxazine), as the electroluminescent polymer of Formula (7) are as follows.

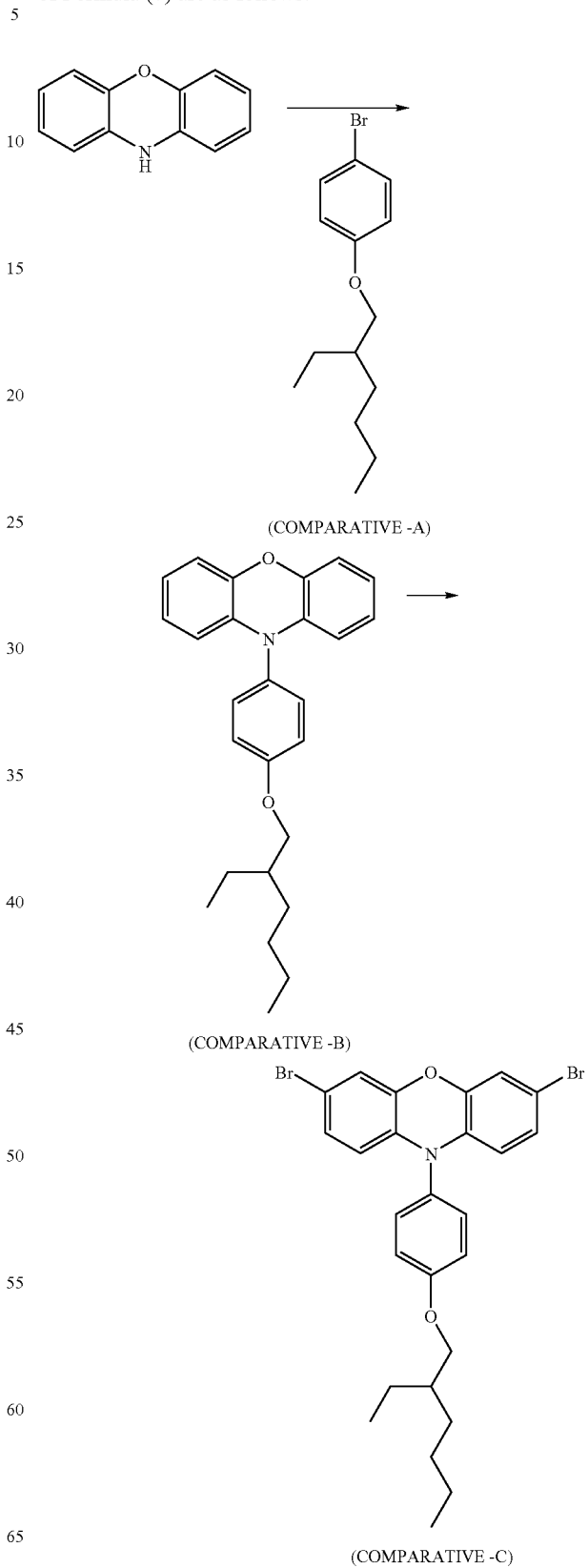

(COMPARATIVE -C)

\+

COMPOUND (F) OF
PREPARATION EXAMPLE 2

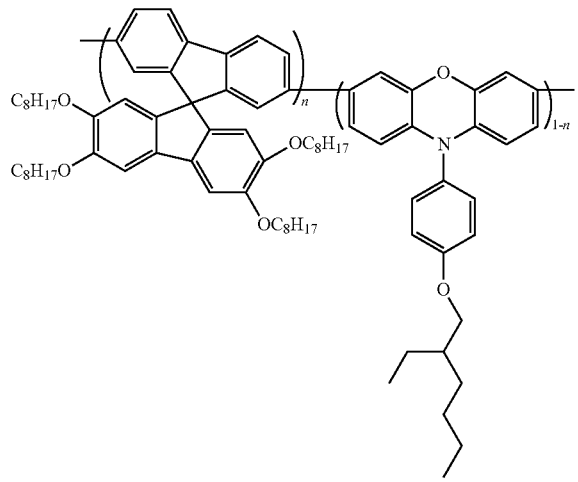

COMPARATIVE EXAMPLE 2

Preparation of a Phenoxazine Monomer (Compound (Comparative-C))

1) Preparation of Compound (Comparative-A)

48.4 g (0.35 mmol) of $K_2CO_3$ was added to a solution of 50 g (0.29 mmol) of 4-bromophenol in 500 ml of acetone, and 73.3 g (0.38 mmol) of 1-bromooctane was added to the mixture and refluxed for 24 hours.

After the reaction was completed, the reaction mixture was extracted using a 2:1 mixture of water and $CHCl_3$ by volume to remove $K_2CO_3$. The organic layers were dried using $MgSO_4$, concentrated, and subjected to silica gel column chromatography using hexane as an eluent. A resulting eluate was distilled under reduced pressure to remove unreacted 1-bromooctane and provide 80 g of Compound (Comparative-A) with a yield of 96%. The structure of Compound (Comparative-A) was identified through $^1$H-NMR.

2) Preparation of Compound (Comparative-B)

18 g (64 mmol) of Compound (Comparative-A), 10 g (54 mmol) of phenoxazine, 7.4 g (77 mmol) of sodium tert-butoxide, 0.61 g (1.1 mmol) of $Pd(dba)_2$ [Tris(dibenzylidene acetone)dipalladium(0)], and 0.22 g (1.1 mmol) of tri(tert-butyl)phosphine were dissolved in 250 ml of xylene and reacted at 80° C. for 12 hours.

After the reaction was completed, the reaction mixture was cooled to room temperature, and 200 ml of distilled water was added to quench the reaction mixture. A 1:1 mixture of xylene and water by volume was extracted from the reaction mixture. The organic layers were dried using $MgSO_4$, concentrated, and subjected to silica gel column chromatography using a 1:2 mixture of toluene and hexane by volume as an eluent. A resulting eluate was concentrated and dried to provide 18.5 g of Compound (Comparative-B) with a yield of 88%. The structure of Compound (Comparative-B) was identified through $^1$H-NMR.

3) Preparation of Compound (Comparative-C)

2.1 equivalents of bromine was slowly added to a solution of 5 g (13 mmol) of Compound (Comparative-B) in 150 ml of $CHCl_3$ with the control of temperature at 0° C. When the complete consumption of the starting material was confirmed through TLC, addition of bromine was stopped, and the reaction mixture was stirred for 10 min.

Next, a small amount of acetone was added to the reaction mixture to quench bromine, followed by extraction using a 2:1 mixture of water and $CHCl_3$ by volume. The organic layers were dried using $MgSO_4$, concentrated, and reprecipitated in methanol to provide 6 g of Compound (Comparative-C) with a yield of 85%. The structure of Compound (Comparative-C) was identified through $^1$H-NMR.

$^1$H-NMR (300 MHz, $CDCl_3$): δ 0.91 (m, 6H), δ1.45 (m, 8H), δ1.82 (m, 1H), δ3.89 (d, 2H), δ5.82 (d, 2H), δ6.5~7.5 (m, 8H)

Preparation of poly(2',3',6',7'-tetraoctyloxyspirofluorene-co-phenoxazine) in a Mole Ratio of 90:10 of Formula (7)

A Schlenk flask was fully evacuated and refluxed with nitrogen gas to completely remove moisture. 880 mg (3.2 mmol) of $Ni(COD)_2$ and 500 mg (3.2 mmol) of bipyridal were injected into the Schlenk flask in a glove box. Next, the flask was fully evacuated again and refluxed with nitrogen gas. 10 ml of anhydrous dimethyl formamide (DMF), 346 mg (3.2 mmol) of 1,5-cyclooctadiene (COD), and 10 ml of anhydrous toluene were added to the flask under nitrogen atmosphere. The reaction mixture was stirred at 80° C. for 30 min, a diluted solution of 87 mg (0.16 mmol) of Compound (Comparative-C) and 1.42 g (1.44 mmol) of Compound (F), i.e., 2',3',6',7'-tetraoctyloxyspirofluorene, prepared in Preparation Example 2 in 10 ml of toluene was added. Next, 10 ml of toluene was added to the flask such that adhering materials on the flask wall were fully incorporated into the solution and stirred at 80° C. for 4 days. Next, 1 ml of bromopentafluorobenzene was added to the mixture and stirred at 80° C. for 1 day.

After the reaction was completed, the temperature of the reaction mixture was dropped to 60° C., and the reaction mixture was poured into a 1:1:2 mixture of HCl, acetone, and methanol by volume to precipitate. The precipitates were dissolved in chloroform, reprecipitated in methanol, and subjected to Soxhlet extraction to give 620 mg of poly(2',3',6',7'-tetraoctyloxyspirofluorene-co-phenoxazine) in a mole ratio of 90:10 with a yield of 80%. As a result of gel permeation chromatography (GPC), the weight average molecular weight (Mw) was 198,000, and the molecular weight distribution (MWD) was 2.07.

Example 4

Manufacture of an Electroluminescent Device

An upper surface of a glass substrate was coated with indium-tin oxide (ITO) to form a transparent electrode (ITO) layer and clearly washed. The ITO layer was patterned into a desired shape using a photoresist rein and etchant and washed. Batron P 4083 (available from Bayer Co.) was coated on the patterned ITO layer to a thickness of 800 Å to form a conductive buffer layer and baked at 180° C. for about 1 hour. 0.05 g of NTSID9 prepared in Preparation Example 1 was dissolved in 5 g of toluene to obtain an electroluminescent polymer solution. The electroluminescent polymer solution was spin coated on the buffer layer, backed, and placed in a vacuum oven to fully remove the solvent and form an emissive layer. Prior to the spin coating, the electroluminescent polymer solution was filtered through a 0.2 mm filter. The concentration of electroluminescent polymer solution and the spinning rate were controlled to form an emissive layer having a thickness of about 80 nm.

Next, calcium and aluminum were sequentially deposited on the emissive layer in a vacuum deposition chamber at a vacuum of $4 \times 10^{-6}$ torr to manufacture an electroluminescent device. The thickness and growth rate of layers during the deposition were controlled using a crystal sensor.

The resulting electroluminescent device had a single stack structure in which ITO, PEDOT, the electroluminescent polymer, Ca, and Al were sequentially stacked upon one another. The emissive area was 4 $mm^2$.

Example 5

Manufacture of Electroluminescent Devices

An electroluminescent device was manufactured in the same manner as in Example 4, except that 0.05 g of NTS9 of Preparation Example 2 was used instead of 0.05 g of NTSID9 of Preparation Example 1, to prepare an electroluminescent polymer solution.

Example 6

Manufacture of Electroluminescent Devices

An electroluminescent device was manufactured in the same manner as in Example 4, except that 0.05 g of NTS29 of Preparation Example 3 was used instead of 0.05 g of NTSID9 of Preparation Example 1, to prepare an electroluminescent polymer solution.

Comparative Example 3

Manufacture of an Electroluminescent Device

An electroluminescent device was manufactured in the same manner as in Example 4, except that 0.05 g of poly(2',3',6',7'-tetraoctyloxyspirofluorene) of Comparative Example 1 was used, instead of 0.05 g of NTSID9 of Preparation Example 1, to prepare the electroluminescent polymer solution.

Comparative Example 4

Manufacture of an Electroluminescent Device

An electroluminescent device was manufactured in the same manner as in Example 4, except that 0.05 g of poly(2',3',6',7'-tetraoctyloxyspirofluorene-co-phenoxazine) in a mole ratio of 90:10 was used, instead of 0.05 g of NTSID9 of Preparation Example 1, to prepare the electroluminescent polymer solution.

The electroluminescent properties were measured using the electroluminescent devices of Examples 4-6 and Comparative Examples 3-4. For this measurement, a forward bias voltage was applied as a direct current (DC) driving voltage. The results are shown in Table 1 below.

As a result of the electroluminescent property measurement, all of the electroluminescent devices manufactured in Examples 4 through 6 and Comparative Examples 3 and 4 exhibit typical rectifying diode characteristics. In particular, the electroluminescent devices of Examples 1 through 3 including the polymers according to embodiments of the present invention show stable voltage-current density properties that stay at initial levels even after operations are repeatedly performed.

Unlike a phenoxazine unit containing oxygen, an iminodibenzyl unit contains an ethylene group, and thus has a twisted structure in its polymer backbone. Hence, shift to short wavelength is easier. Also, a polymer having long lifetime was obtained due to low interface effect and high film packing density using bulkily fused to nitrogen aromatic structure in a penoxazine unit.

Especially in the case of color purity, the electroluminescent devices of Examples 1 through 3 containing polymers have remarkably lower y value compared to the electroluminescent device of Comparative Example 2, hence the electroluminescent devices of Examples 1 through 3 have wide blue area.

As described above, an electroluminescent polymer according to the present invention shows strong and stable emissive properties. In addition, when the electroluminescent polymer according to the present invention is used for organic layers, in particular, an emissive layer, of an electroluminescent device, color purity, luminance and efficiency of the organic electroluminescent device are improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An organic electroluminescent device, comprising:
a first electrode;
a second electrode; and
an organic layer between the first electrode and the second electrode, the organic layer containing a polymer having a degree of polymerization in the range of 10 to 2,000, the polymer comprising:
1 through 99 mole % of a repeating unit represented by Formula (1); and

TABLE 1

| | Example | | | | |
|---|---|---|---|---|---|
| | Example 4 | Example 5 | Example 6 | Comparative Example 3 | Comparative Example 4 |
| Emissive polymer | NTSID9 of Preparation Example 1 | NTS9 of Preparation Example 2 | NTS29 of Preparation Example 3 | Compound of Comparative Example 1 | Compound of Comparative Example 2 |
| Maximum emission wavelength (nm) | 460 | 475 | 470 | 437, 464 | 479 |
| Maximum efficiency (cd/A) | 2.0 | 3.8 | 3.1 | 1.8 | 4.8 |
| Driving voltage (V) | 3.4 | 2.8 | 3.0 | 4.0 | 3.2 |
| Half-lifetime (hr) (@100 cd/m$^2$) | 17,000 | 46,000 | 37,400 | 720 | 31,000 |
| Color coordinates (x, y) | (0.16, 0.10) | (0.15, 0.30) | (0.15, 0.26) | (0.15, 0.20) | (0.15, 0.32) |

99 through 1 mole % of a repeating unit represented by Formula (2):

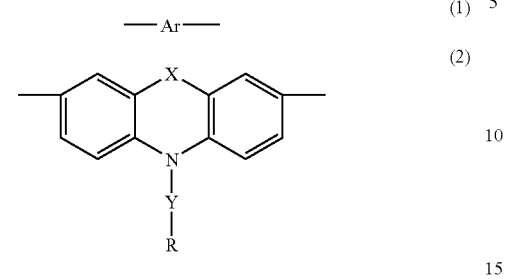
(1)
(2)

where Ar is a $C_{6-26}$ aromatic group or a $C_{4-20}$ heteroaromatic group comprising at least one heteroatom in the aromatic ring, where the aromatic group or the heteroaromatic group is unsubstituted or substituted with at least one of a $C_{1-12}$ alkyl group, a $C_{1-12}$ alkoxy group, and —N(R')(R") where R' and R" are each independently a hydrogen atom or a $C_{1-12}$ alkyl group;

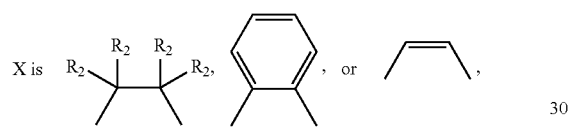

where $R_1$ and $R_2$ are each independently a hydrogen atom, a $C_{1-12}$ linear alkyl group, a $C_{1-12}$ branched alkyl group or a $C_{1-12}$ alkoxy group;

Y is phenylene, naphthalene or anthracene;

R is a hydrogen atom, a $C_{1-12}$ linear alkyl group, a $C_{1-12}$ branched alkyl group, a $C_{1-12}$ alkoxy group or a $C_{5-30}$ cycloalkyl group, or a $C_{6-14}$ aromatic group which is unsubstituted or substituted with at least one of a $C_{1-12}$ alkyl group, a $C_{1-12}$ alkoxy group, and —N(R')(R") where R' and R" are independently a hydrogen atom or a $C_{1-12}$ alkyl group.

2. The organic electroluminescent device of claim 1, wherein the Ar unit of Formula (1) is selected from the group consisting of Formulas (1a) through (1 aa):

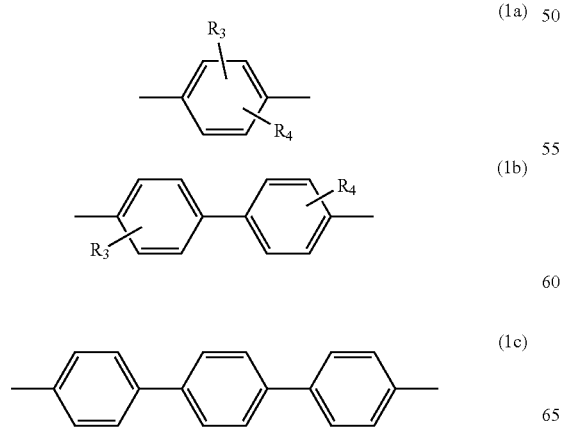
(1a)
(1b)
(1c)

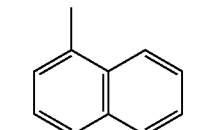
(1d)

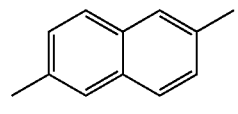
(1e)

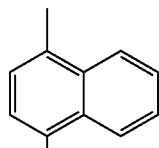
(1f)

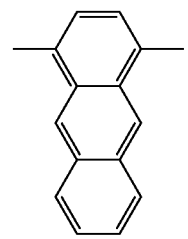
(1g)

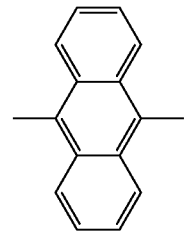
(1h)

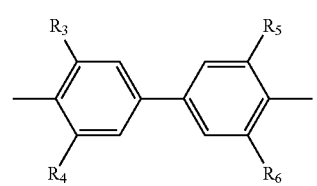
(1i)

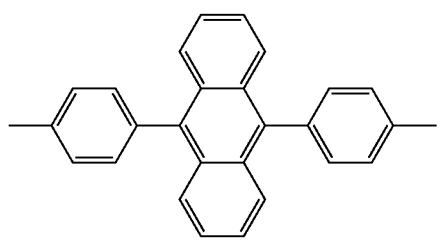
(1j)

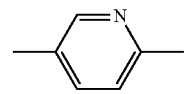
(1k)

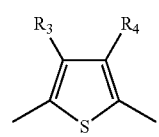
(1l)

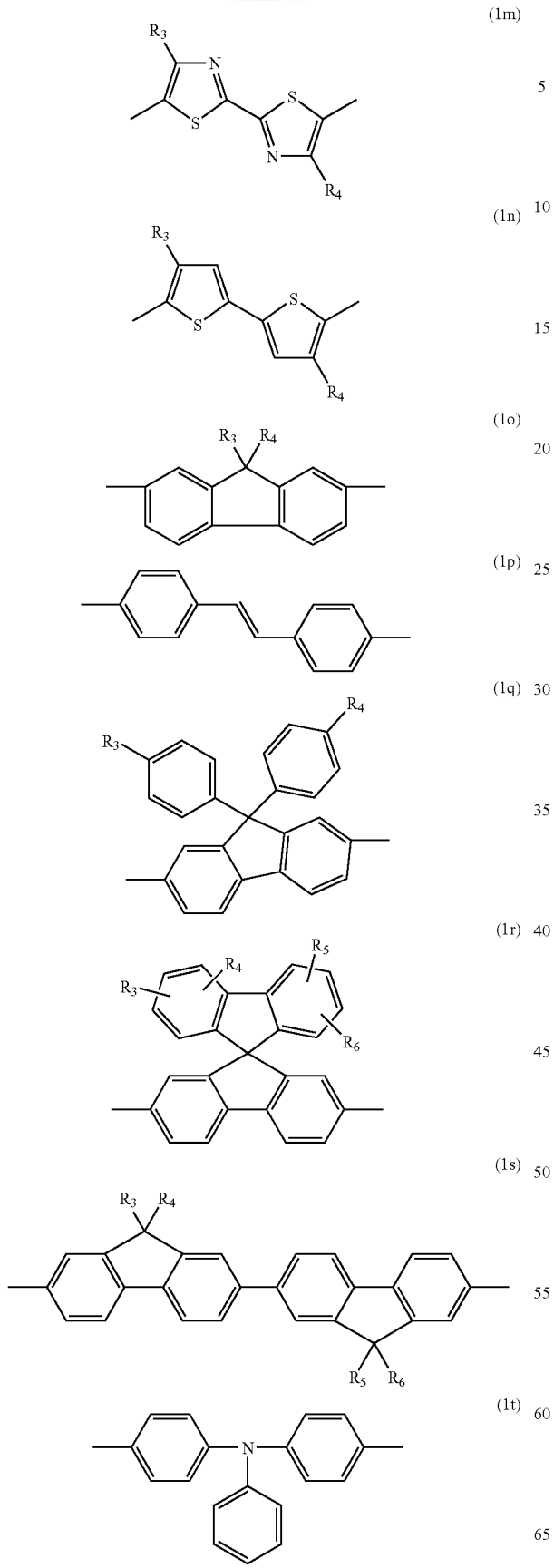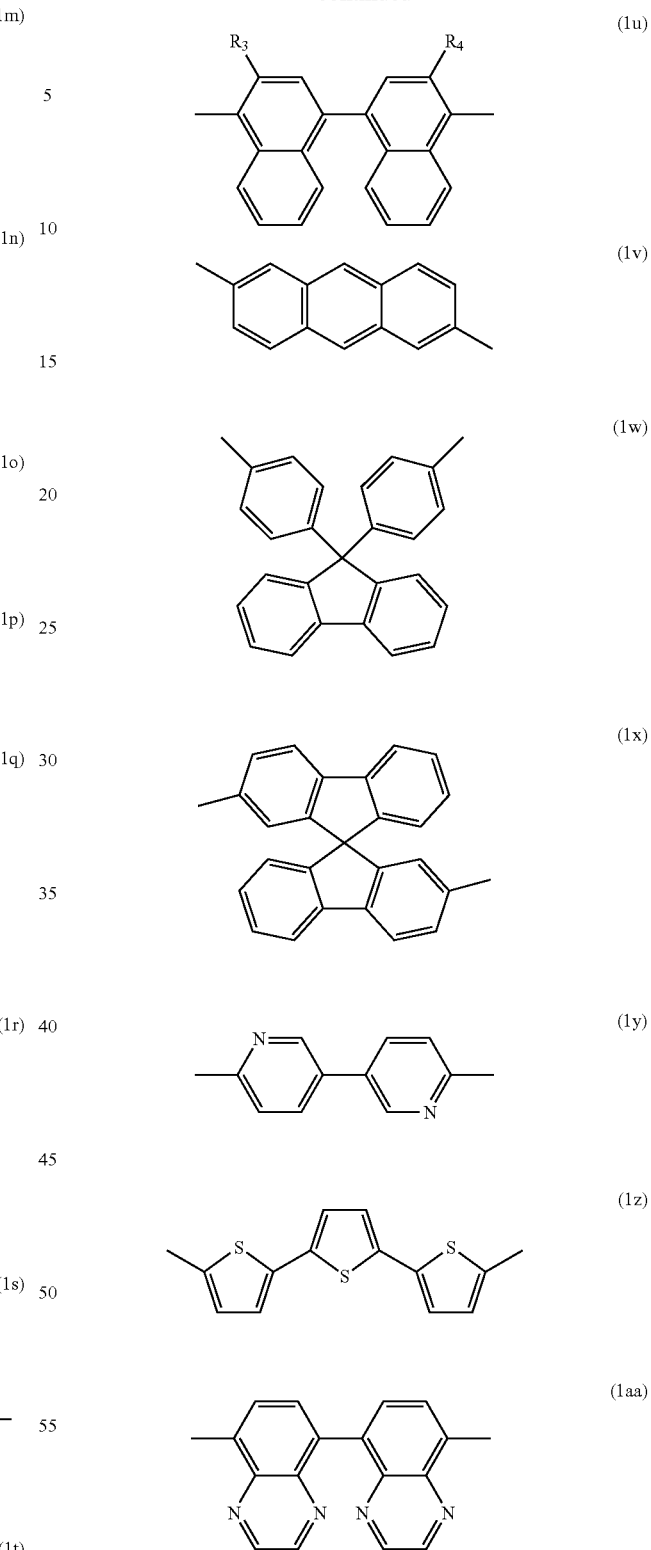
where $R_3$, $R_4$, $R_5$, and $R_6$ are each independently hydrogen, a $C_{1-12}$ alkyl group, a $C_{1-12}$ alkoxy group, a $C_{6-20}$ alkyl group or —N(R')(R") where R' and R" are independently a hydrogen atom or a $C_{1-12}$ alkyl group.

3. The organic electroluminescent device of claim 1, wherein the Ar unit of Formula (1) is Formula (1o), (1q) or (1r):

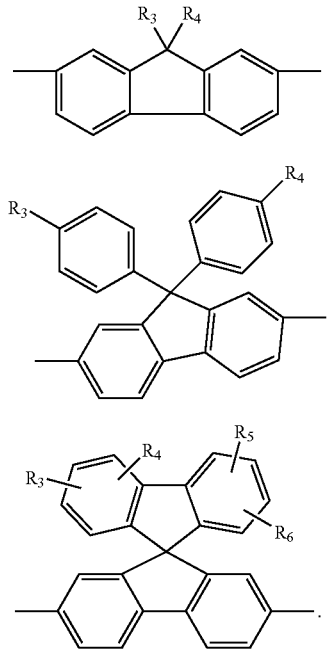

(1o)

(1q)

(1r)

4. The organic electroluminescent device of claim 1, the polymer having a weight average molecular weight of 10,000-2,000,000 and a molecular weight distribution of 1.5 to 5.

5. The organic electroluminescent device of claim 1, the polymer represented by Formula (4):

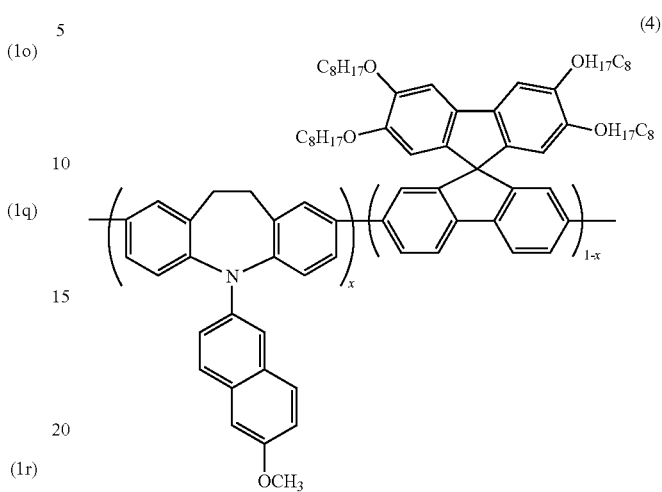

(4)

where x is a real number in the range of 0.01 to 0.99.

6. The organic electroluminescent device of claim 1, wherein the organic layer comprises an emissive layer containing the polymer.

7. The organic electroluminescent device of claim 1, wherein the organic layer comprises an emissive layer and a hole transport layer containing the polymer between the emissive layer and the second electrode.

8. The organic electroluminescent device of claim 1, wherein the organic layer comprises an emissive layer containing the polymer and a hole transport layer containing the polymer between the emissive layer and the second electrode.

* * * * *